US008603648B2

United States Patent
Katsura et al.

(10) Patent No.: US 8,603,648 B2
(45) Date of Patent: Dec. 10, 2013

(54) REFLECTIVE FILM LAMINATE

(75) Inventors: Sho Katsura, Kobe (JP); Nobuhiro Kobayashi, Kobe (JP); Jun Suzuki, Kobe (JP); Toshiki Sato, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 12/984,056

(22) Filed: Jan. 4, 2011

(65) Prior Publication Data
US 2011/0189474 A1 Aug. 4, 2011

(30) Foreign Application Priority Data

Feb. 1, 2010 (JP) ................................. 2010-020555
Aug. 26, 2010 (JP) ................................. 2010-189832

(51) Int. Cl.
*B32B 17/06* (2006.01)
*B32B 15/04* (2006.01)
*C23C 14/00* (2006.01)

(52) U.S. Cl.
USPC ........... 428/701; 428/432; 428/697; 428/699; 428/702; 204/192.1

(58) Field of Classification Search
USPC ........ 428/432, 697, 699, 701, 702; 204/192.1
See application file for complete search history.

(56) References Cited

U.S. PATENT DOCUMENTS

| | | | | | |
|---|---|---|---|---|---|
| 5,403,657 | A | * | 4/1995 | Textor et al. ................... | 428/336 |
| 5,582,863 | A | * | 12/1996 | Textor et al. ................... | 427/162 |
| 5,663,001 | A | * | 9/1997 | Textor et al. ................... | 428/469 |
| 5,756,222 | A | * | 5/1998 | Bercaw et al. ................. | 428/649 |
| 5,840,466 | A | * | 11/1998 | Nonaka et al. ............ | 430/270.13 |
| 5,919,561 | A | * | 7/1999 | Fuchs et al. .................... | 428/336 |
| 6,300,039 | B1 | * | 10/2001 | Ohbayashi et al. ....... | 430/270.13 |
| 6,848,797 | B1 | * | 2/2005 | Gillich et al. .................. | 359/883 |
| 2001/0024323 | A1 | * | 9/2001 | Yanagi et al. .................. | 359/514 |
| 2002/0001865 | A1 | | 1/2002 | Zhang | |
| 2003/0203147 | A1 | * | 10/2003 | Usami et al. .................. | 428/64.1 |
| 2004/0233530 | A1 | * | 11/2004 | Kramer et al. ................. | 359/507 |
| 2005/0115839 | A1 | * | 6/2005 | Dolan ............................ | 205/104 |
| 2006/0181772 | A1 | * | 8/2006 | Byers et al. .................... | 359/512 |
| 2007/0133381 | A1 | * | 6/2007 | Kondo et al. ............... | 369/275.4 |
| 2008/0171196 | A1 | * | 7/2008 | Sato et al. ...................... | 428/336 |
| 2008/0279079 | A1 | * | 11/2008 | Hosoda et al. ................. | 369/94 |
| 2010/0053785 | A1 | * | 3/2010 | Nishi et al. ..................... | 359/838 |

FOREIGN PATENT DOCUMENTS

| | | |
|---|---|---|
| EP | 0 495 755 A1 | 7/1992 |
| EP | 0 824 154 A1 | 2/1998 |
| JP | 7-301705 | 11/1995 |
| JP | 11-221517 | 8/1999 |
| JP | 2010097066 * | 4/2010 |

OTHER PUBLICATIONS

JP-2010097066 English machine translation.*
Vocabulary.com (https://www.vocabulary.com/dictionary/substrate), 2013.*
Extended Search Report issued Apr. 7, 2011 in European Patent Application No. 11000123.7-2217.
U.S. Appl. No. 13/522,820, filed Jul. 18, 2012, Katsura, et al.
Office Action issued Feb. 17, 2013 in Chinese Patent Application No. 201110022270.9 (with English translation).
Yedong IIE, et al., "Introduction of Material Corrosion and Anticorrosion", China Machine Press, Feb. 28, 2005, 3 pages.

* cited by examiner

*Primary Examiner* — David Sample
*Assistant Examiner* — Lauren Colgan
(74) *Attorney, Agent, or Firm* — Oblon, Spivak, McClelland, Maier & Neustadt, L.L.P.

(57) ABSTRACT

A reflective film laminate is provided with high productivity and at low cost in which a protective film with minimized pinholes is provided to improve the alkali resistance and warm water resistance of the reflective film laminate including a pure Al film or an Al-based alloy film so that a reflectivity reduction resulting from the elution or oxidization of the Al film in an alkaline or warm water environment is less likely to occur. The reflective film laminate of the present invention includes, over a substrate, a pure Al film or an Al-based alloy film as a first layer, and an oxide film of a metal containing one or more elements selected from the group consisting of Zr, Cr, Y, Nb, Hf, Ta, W, Ti, Si, and Mo as a second layer over the first layer. The thickness of the second layer is 0.1 to 10 nm.

20 Claims, No Drawings

REFLECTIVE FILM LAMINATE

FIELD OF THE INVENTION

The present invention relates to a reflective film laminate, and a vehicular lighting fixture, a lighting device, and an optical mirror each including the reflective film laminate.

BACKGROUND OF THE INVENTION

Because of having a high reflectivity (88% to 90%), a pure Al film is used as a reflective film for a vehicular lighting fixture, a lighting device, an ornament, or the like. Durability required of a reflective film includes mild acidity resistance, alkali resistance, warm water resistance, heat resistance, moisture resistance, sulfidation resistance, salt water resistance, and the like. However, since the pure Al film is made of an amphoteric metal, the corrosion resistance thereof to an acid or alkali is low. As a result, when a reflective film (pure Al reflective film) formed of a pure Al film is used for a vehicular lighting fixture or the like, a problem arises that the reflective film deteriorates in a short period or time, and cannot retain a high reflectivity over a long period of time.

As a method for maintaining the high reflectivity of the pure Al reflective film for a long period of time, there is a method which forms a protective film having corrosion resistance to an acid or alkali on a surface of a pure Al reflective film. However, in such a method, if a defect such as a pinhole exists in the protective film, corrosion (oxidation or elution) of the pure Al film may occur via the defective portion to cause a reduction in reflectivity. The reduction in reflectivity resulting from a defect such as a pinhole can be inhibited by increasing the thickness of the protective film, but the productivity of a product lowers to increase cost. Therefore, the thickening of the protective film is not an effective means.

In view of the circumstances, Japanese Unexamined Patent Application Publication No. Hei 11 (1999)-221517 discloses a method which forms a protective film (top-coat) in which a defect such as a pinhole is less likely to occur on a surface of a reflective film. Specifically, a method is disclosed in which a monomer of a top-coat material such as HMDS (hexamethyldisiloxane) or TEOS (tetraethylorthosilicate) is introduced into a vacuum vessel under a pressure environment under which a plasma is highly likely to be generated, and the monomer mentioned above is polymerized in the plasma to be precipitated on the surface of the reflective film to provide the top-coat on the surface of the reflective film. However, in such a method, the maintenance (such as cleaning of the inside of the vacuum vessel) of an apparatus used to form the protective film (top-coat) is required, and consequently the productivity of a product may lower. In addition, Japanese Unexamined Patent Application Publication No. Hei 11 (1999)-221517 described above also discloses a laminate in which an undercoat, a plasma processed layer, and a top-coat are successively formed over a resin base material, which leads to the problem of a reflectivity reduction due to an increased thickness.

Besides, as a method for maintaining the high reflectivity of the pure Al reflective film for a long period of time, a method which alloys Al with another element is also disclosed. For example, Japanese Unexamined Patent Application Publication No. Hei 07 (1995)-301705 discloses an Al alloy reflective film doped with a IIIa-group, IVa-group, Va-group, VIa-group, VIIa-group, or VIII-group transition metal element in the periodic table. The Al alloy reflective film shows high corrosion resistance in an acidic to neutral range but, according to the alloy design concept therefor, a chemically stable passive coating is formed so that no consideration has been given to an improvement in corrosion resistance in an alkaline range in which the dissolution of the passive coating advances corrosion. As a result, a problem arises that, if there is a defect such as a pinhole, corrosion (elution due to an alkali) of the Al alloy reflective film occurs via the defective portion to reduce the reflectivity.

In the meantime, a vehicular lighting fixture such as a headlamp or a rear lamp has the problem that dew drops and water droplets are highly likely to be formed therein. This is because outside air containing moisture flows into the vehicular lighting fixture, and the vehicular lighting fixture is heated by heat generated from a light source during a lighting period, while being cooled by the outside air or rain during a non-lighting period, thereby being subjected to repeated heating and cooling. The formation of the water droplets causes the reflective film provided in the vehicular lighting fixture to become transparent (oxidized), and causes a reduction in the reflectivity thereof or the like. Therefore, there is strong demand for a reflective film which is excellent not only in mild acidity resistance and alkali resistance, but also in warm water resistance. Similar problems are also observed in a lighting device, an optical mirror, and the like.

SUMMARY OF THE INVENTION

The present invention has been achieved under circumstances as described above, and an object of the present invention is to provide a reflective film laminate with high productivity and at low cost, in which a protective film with minimized pinholes is provided to improve the alkali resistance and warm water resistance of the reflective film laminate including a pure Al film or an Al-based alloy film (which may be hereinafter referred to as "Al film") so that a reduction in the reflectivity of the Al film resulting from the elution or oxidization of Al in an alkaline or warm water environment is less likely to occur.

A reflective film laminate of the present invention which has allowed the foregoing problems to be solved includes, over a substrate, a pure Al film or an Al-based alloy film as a first layer, and an oxide film of a metal containing one or more elements selected from the group consisting of Zr, Cr, Y, Nb, Hf, Ta, W, Ti, Si, and Mo as a second layer over the foregoing first layer, wherein a thickness of the second layer is 0.1 to 10 nm.

Note that, in the present specification, the wording "over a substrate" or "over the layer" used above involves the case where the first layer or the second layer is provided immediately thereover, and the case where the first layer or the second layer is provided thereover with another film interposed therebetween.

In the present specification, the wording "oxide film of a metal containing one or more elements" indicates that the metal forming the oxide film as the second layer contains at least one of the elements in the foregoing group. Specifically, it is indicated that the foregoing metal may be made only of the element in the group, or may also contain, in addition to at least one of the elements in the foregoing group, another element not included in the foregoing group within a range which does not inhibit the effects achieved by using the element in the foregoing group. Examples of the foregoing "another element" include Al, Fe, and Cu.

In a preferred embodiment, in the reflective film laminate of the present invention, the foregoing first layer is the Al-based alloy film containing 0.05 to 2.5 atomic % of a rare earth metal element, the Al-based alloy film containing 0.05 to 3 atomic % of Zr, or the Al-based alloy film containing 0.2 to 6.3 atomic % of Mg.

In the present specification, the rare earth metal elements indicate elements including Sc and Y in addition to lanthanoids.

The "pure Al film" in the present invention indicates a pure Al film containing 98.5 atomic % or more of Al, with the remainder being made of an inevitable impurity. Note that, when the inevitable impurity is a rare earth metal element or Zr, the content thereof is less than 0.05 atomic %. When the inevitable impurity is Mg, the content of Mg is less than 0.2 atomic %.

In another preferred embodiment, the reflective film laminate of the present invention includes, as the foregoing second layer, an oxide film of a metal made of one or more selected from the group consisting of Zr, Cr, Nb, Ta, and Ti.

The present invention also includes a method for producing the foregoing reflective film laminate, which includes the steps of forming the foregoing first layer over the substrate, and sputtering a sputtering target made of the metal of the foregoing element to form a sputter metal thin film over the foregoing first layer, and then oxidizing the foregoing sputter metal thin film in an atmosphere containing oxygen to form the foregoing second layer.

In the present specification, the wording "oxidizing" is intended to involve each form in which the foregoing sputter metal thin film is exposed to the atmosphere containing oxygen, and at least a part thereof is oxidized irrespective of the purpose of oxidation. For example, the wording "oxidizing" involves the case where the foregoing sputter metal thin film is intentionally oxidized in the atmosphere containing oxygen and the case where the laminate in which the sputter metal thin film is formed over the first layer is merely allowed to stand in the atmosphere containing oxygen, and the foregoing sputter metal thin film is resultantly oxidized thereby.

In the present invention, when the second layer having the oxide film of the metal containing a predetermined element is formed over the first layer, the sputtering target (which is not a sputtering target of a metal oxide) made of the metal of the foregoing element is sputtered to form the sputter metal thin film, and then the sputter metal thin film is subjected to oxidation treatment. Therefore, it is possible to obtain a pinhole sealing effect due to volume expansion during the oxidation of the metal.

The present invention also further includes a vehicular lighting fixture, a lighting device, and an optical mirror each including the foregoing reflective film laminate.

The reflective film laminate of the present invention protects the Al film as the first layer with the oxide film (the second layer) of the metal containing the predetermined element. Therefore, it is expected that, through the suppression of the elution or oxidation of the Al film in an alkali environment or a warm water environment, alkali resistance and warm water resistance are improved, and a high reflectivity is maintained for a long time. In addition, since the high reflectivity can be maintained for a long time, by using the reflective film laminate of the present invention as a vehicular lighting fixture, a lighting device, or an optical mirror, an improvement in the durability thereof can be expected.

DETAILED DESCRIPTION OF THE PREFERRED EMBODIMENTS

A reflective film laminate of the present invention includes, over a substrate, a pure Al film or an Al-based alloy film as a first layer, and an oxide film of a metal containing one or more elements selected from the group consisting of Zr, Cr, Y, Nb, Hf, Ta, W, Ti, Si, and Mo as a second layer over the first layer, wherein a thickness of the foregoing second layer is 0.1 to 10 nm.

The present inventors have conducted intensive studies to provide a reflective film laminate using an Al film, and having a high reflectivity required for a vehicular lighting fixture, a lighting device, an optical mirror, and the like, in which the elution of Al due to an alkali can also be prevented. As a result, the present inventors have found that it is effective to form, as the second layer, an oxide film of a metal containing a predetermined element such as Zr over the Al film.

Details of the mechanism of the reflective film laminate of the present invention having high alkali resistance and high warm water resistance is unknown, but can be presumed as follows.

That is, the oxide film of a metal such as Zr forming the second layer is resistant to the diffusion or penetration of moisture and an alkali therein, and also inherently has excellent alkali resistance and warm water resistance. As will be described later, in the formation of the second layer in the present invention, the metal film containing a predetermined element such as Zr is preliminarily formed, and then the metal film is oxidized to provide the metal oxide film. Because a predetermined element such as Zr experiences volume expansion through oxidation, even when the metal oxide film (second layer) is thinned, the effect of suppressing the formation of pinholes can be expected.

In addition, due to the properties of the metal oxide film (second layer) mentioned above, the thickness of the second layer can be reduced to 0.1 to 10 nm. Therefore, even when the second layer is provided, it is possible to prevent a reduction in the high reflectively of the reflective film laminate.

Hereinbelow, a detailed description will be given of the reflective film laminate of the present invention.

(First Layer)

First, a description will be given of the Al film (first layer) provided in the reflective film laminate of the present invention. The first layer provided in the reflective film laminate of the present invention is for achieving a high reflectivity, and formed of the pure Al film or the Al-based alloy film.

Here, the "pure Al film" in the present invention contains 98.5 atomic % or more (preferably 98.8 atomic % or more, and more preferably 99.0 atomic % or more) of Al, with the remainder being made of an inevitable impurity.

Examples of the alloy element used in the Al-based alloy film include an element (such as, e.g., a rare earth metal element such as Gd, La, or Y, Zr, or Mg) capable of improving the alkali resistance without reducing the high reflectivity of pure Al.

As described above, the reflectivity of the pure Al film is 88 to 90%, which is higher than the reflectivities of other typical metal materials. On the other hand, the pure Al film has particularly low corrosion resistance to an alkali. Accordingly, in the case of using the reflective film laminate of the present invention in an alkali environment, an Al-based alloy film containing, e.g., a rare earth metal (REM) element is preferably used. The reflective film laminate of the present invention is intended to improve alkali resistance and warm water resistance primarily using the second layer made of the metal oxide film. However, by also using the Al-based alloy film contributing to improvements in these properties as the first layer, further improvements can be achieved in the properties mentioned above. Of the REM elements, Gd, La, and Y are more preferred. The REM elements may be used alone or in combination of two or more kinds.

A REM element has the function of improving the alkali resistance of an Al film. To effectively achieve such a function, and improve the alkali resistance of the Al film, it is preferred to control the lower limit of the REM content in the Al-based alloy film to 0.05 atomic % (preferably 0.1 atomic %, and more preferably 0.15 atomic %). However, when the REM content increases, the effect of improving the alkali resistance is saturated, while a reduction in reflectivity occurs. Therefore, it is preferred to control the upper limit of the REM content to 2.5 atomic % (preferably 1.8 atomic %, and more preferably 1.5 atomic %).

Examples of such an Al-based alloy film include one containing the REM element in the foregoing amount, with the remainder being made of Al and an inevitable impurity.

The Al-based alloy film used as the first layer of the present invention may also contain Zr or Mg in addition to or instead of the REM element mentioned above.

Zr has the function of improving adhesion between the Al-based alloy film (first layer) and the metal oxide film (second layer) so that the alkali resistance and the warm water resistance are resultantly increased. To effectively achieve such a function, it is preferred to control the lower limit of the Zr content in the Al-based alloy film to 0.05 atomic % (preferably 0.1 atomic %, and more preferably 0.15 atomic %). Note that it is preferred to control the upper limit of the Zr content to 3 atomic % (preferably 2.5 atomic %, and more preferably 2 atomic %). This is because, even if Zr is contained in an amount in excess of 3 atomic %, the effect of improving the alkali resistance described above is saturated, while a reduction in reflectivity occurs.

Examples of such an Al-based alloy film include one containing the REM element and Zr in the foregoing amounts, with the remainder being made of Al and an inevitable impurity, and one containing Zr in the foregoing amount (without containing the REM element), with the remainder being made of Al and an inevitable impurity.

Mg has the function of improving the alkali resistance of Al, similarly to the REM element. To effectively achieve such a function, it is preferred to control the lower limit of the Mg content in the Al-based alloy film to 0.2 atomic % (preferably 0.25 atomic %, and more preferably 0.3 atomic %). When the Mg content increases, the effect of improving the alkali resistance is saturated, while a reduction in reflectivity occurs. Therefore, it is preferred to control the upper limit of the Mg content to 6.3 atomic % (preferably 6.0 atomic %, and more preferably 5.5 atomic %).

Examples of such an Al-based alloy film include one containing the REM element and Mg in the foregoing amounts, with the remainder being made of Al and an inevitable impurity, one containing Zr and Mg in the foregoing amounts, with the remainder being made of Al and an inevitable impurity, one containing the REM element, Zr, and Mg in the foregoing amounts, with the remainder being made of Al and an inevitable impurity, and one containing Mg in the foregoing amount (without containing the REM element and Zr) with the remainder being made of Al and an inevitable impurity.

The average contents of various additive elements in the Al-based alloy film can be measured by ICP (Inductively Coupled Plasma) atomic emission spectrometry or ICP mass spectrometry. Details of a measurement method will be described later.

(Second Layer)

The second layer provided in the reflective film laminate of the present invention is for achieving durability against an alkali and warm water, and characterized by having an oxide film of a metal containing one or more elements selected from the group consisting of Zr, Cr, Y, Nb, Hf, Ta, W, Ti, Si, and Mo (which may be hereinafter referred to simply as "metal oxide film").

The foregoing element forming the second layer is selected as an element having a PB ratio (Pilling-Bedworth ratio obtained by dividing the volume of a metal oxide per unit mole by the volume of the corresponding metal per unit mole) of more than 1, and causing volume expansion during oxidation. From the foregoing element, the effect of sealing pinholes during oxidation can be expected. In addition, since the metal oxide film inherently has excellent durability, there is no degradation of the second layer, and no degradation of the Al film (first layer) resulting from degradation of the second layer. If the Al film as the first layer remains in the state of a metal film, the high reflectivity characteristic of the first-layer Al film is impaired. However, by being changed into the metal oxide film, the Al film becomes transparent, and therefore it is possible to prevent a reduction in the reflectivity of the reflective film laminate. In the present invention, it is preferred to use one or more selected from the group consisting of Zr, Cr, Nb, Ta, and Ti among the foregoing elements.

In the present invention, the thickness of the second layer is adjusted to be not less than 0.1 nm (preferably not less than 0.15 nm, more preferably not less than 0.2 nm, and most preferably not less than 0.5 nm) and not more than 10 nm (preferably not more than 7 nm, and more preferably not more than 5 nm). If the thickness of the second layer is within the foregoing range, it is possible to obtain the metal oxide film (second layer) oxidized throughout the thickness direction. Accordingly, it is possible to cause the second layer to become transparent, and prevent a reduction in the reflectivity of the reflective film laminate of the present invention.

When the thickness of the second layer is less than 0.1 nm, the foregoing durability improving effect obtained by providing the second layer may not be able to be fully achieved. As the thickness of the second layer increases, the pinhole size is reduced, and therefore the sealing of pinholes in the metal oxide film is considered to be easier. However, there is a case where it becomes difficult to oxidize the second layer throughout the thickness direction thereof, and the second layer does not become sufficiently transparent so that the reflectivity of the reflective film laminate of the present invention is reduced.

For example, in the case of providing a reflective film laminate having a high reflectivity in addition to high durability, the foregoing second layer is preferably a metal oxide film oxidized throughout the thickness direction. However, if this is not the case, it is sufficient for the second layer to contain at least an oxide of a metal containing a predetermined element, and a part thereof may remain in a metal state.

(Substrate)

The material of a substrate used in the reflective film laminate of the present invention is not particularly limited as long as it is normally used in the field of a lighting device, a vehicular lighting fixture, an optical mirror, or the like including an Al film, and examples thereof include resin and glass. Examples of the resin include a polycarbonate resin, an acrylic resin, a polyester resin such as PET (polyethylene terephthalate) or PBT (polybutylene terephthalate), an ABS resin, an epoxy resin, an acetal resin, an aliphatic hydrocarbon resin, and a mixture thereof.

In the present invention, the material of the substrate is preferably determined according to the temperature of heat emitted from a light source. For example, when the temperature of the light source is about not less than 180° C., glass is used preferably. When the temperature of the light source is about 120 to 180° C., a polyester resin such as PET or PBT is used preferably. When the temperature of the light source is about not more than 120° C., a polycarbonate resin is used preferably.

Otherwise, it may also be possible to use a resin material having a water absorption which is less than 0.1% when measured by the method A (method of measuring an amount of absorbed water after immersion in pure water at 23° C. for 24 hours) prescribed in JIS K7209. By thus using the substrate (substrate having a small moisture absorption) having an excellent moisture-proof property (water-proof property), it is possible to suppress a reduction in the reflectivity of the Al film resulting from moisture contained in the substrate or moisture that has penetrated into the substrate from the substrate surface (back surface) not formed with the Al film, and therefore obtain the reflective film laminate having an excellent moisture-proof property.

Examples of a resin which satisfies the foregoing requirement include a PET resin (having a water absorption of 0.05%) and a PPS (polyphenylene sulfide) resin (having a water absorption of 0.03%). A preferable water absorption of the substrate is not more than 0.08%, and a more preferable water absorption thereof is not more than 0.06%.

(Third Layer)

As a representative example of the reflective film laminate of the present invention, a reflective film laminate in which the foregoing first and second layers are successively laminated over the substrate can be shown, but the reflective film laminate of the present invention is not limited thereto. For example, the second layer may also be laminated over the first layer via an Al oxide film. Even when the Al oxide film exists, there is no degradation of the durability and reflectivity of the reflective film laminate of the present invention.

Alternatively, to further improve the durability of the reflective film laminate of the present invention, and maintain the high reflectivity thereof for a longer period of time, a known plasma polymerization film or resin film may also be further provided over the second layer.

For example, there can be shown a form in which, using organic silicon, a plasma polymerization film is formed. Examples of the organic silicon include hexamethyldisiloxane, hexamethyldisilazane, and triethoxysilane.

A preferable thickness of the plasma polymerization film is 5 to 500 nm, and a more preferable thickness thereof is 10 to 400 nm. When the thickness is reduced, a barrier property deteriorates. On the other hand, when the thickness is increased, a film stress increases to possibly cause a crack or peeling when, after laminate deposition, a heat resistance test and a moisture resistance test are performed.

Examples of a resin material for forming the resin film include an acrylic resin and a silicone resin. A preferable thickness of the resin film is 0.1 to 20 μm. When the thickness is out of the range, the same problems as described above occur.

(Properties and Applications of Reflective Film Laminate)

The reflective film laminate of the present invention has, over the first layer made of the Al film, the oxide film (second layer) of a metal containing a predetermined element such as Zr. Accordingly, even when the thickness of the second layer is reduced (to 0.1 to 10 nm), a pinhole sealing effect can be obtained, and excellent alkali resistance and warm water resistance as well as a high reflectivity can be achieved.

Since the reflectivity of the reflective film laminate of the present invention is extremely high, if the reflective film laminate of the present invention is used for an application such as a vehicular lighting fixture, a lighting device, or an optical mirror, even when the power consumption of a light source (lamp) is reduced to be lower than a conventional level, brightness of the same order as achieved conventionally can be ensured. In addition, when a plurality of lamps are used, the number of the lamps can be reduced, and therefore cost expended on the light source can be reduced.

Here, a vehicular lighting fixture indicates the headlamp or rear lamp of an automobile or a motorcycle. The reflective film laminate of the present invention is used appropriately for the reflective plate or extension of such a lamp. A lighting device indicates a downlight, a fluorescent light, or the like. Lighting devices also include a lighting device using an LED or an organic EL as a light source. An optical mirror indicates the mirror of an electronic flash for a camera, a mirror in an analyzer utilizing the reflection of light, or the like.

(Method for Producing Reflective Film Laminate of Present Invention)

To allow the second layer (metal oxide film) provided in the present invention to achieve a sufficient pinhole sealing effect with a thickness of 0.1 to 10 nm, the production of the reflective film laminate of the present invention is preferably performed by preliminarily forming the metal film containing a predetermined element such as Zr over the first layer (Al film), and then oxidizing the metal film to provide the metal oxide film (form the second layer), as described above.

By oxidizing the metal film of Zr or the like after the formation thereof and forming the metal oxide film as the second layer, the pinhole sealing effect due to volume expansion during oxidation is effectively achieved.

Examples of the method for producing the reflective film laminate of the present invention include a producing method including the step of forming, over the substrate, the foregoing first layer, and the step of sputtering a sputtering target made of the metal of the foregoing element to form a sputter metal thin film over the first layer, and then oxidizing the foregoing sputter metal thin film in an atmosphere containing oxygen to form the foregoing second layer. Hereinafter, a description will be given of such a method for producing the reflective film laminate.

Examples of a method for forming the Al film forming the first layer include a method which uses a pure Al sputtering target or an Al-based alloy sputtering target, and deposits the film by a sputtering method. It is particularly preferred to deposit the film by a DC sputtering method using a direct-current cathode.

A method for forming a sputter metal thin film in the formation of the second layer is not particularly limited, and examples thereof include a method which uses a sputtering target made of the metal of the foregoing element, and deposits the film by a sputtering method. It is particularly preferred to deposit the film by a DC sputtering method using a direct-current cathode.

The element used in the formation of the second layer is a metal liable to oxidation. Therefore, the sputter metal thin film can be oxidized by being held in atmospheric air for a long time (normally about 24 hours) (i.e., by natural oxidation). At this time, a longtime is required for the oxidation of the sputter metal thin film. Accordingly, to accelerate the oxidation, it is preferred to hold the sputter metal thin film, while performing heat treatment at a high temperature (appropriate if it is not more than the heat resistance temperature of the substrate) thereto. Otherwise, the sputter metal thin film may also be oxidized by a method which holds the sputter metal thin film in an atmosphere having an oxygen concentration higher than that of atmospheric air (and may further perform heat treatment at a high temperature thereto), or oxidized by $O_2$ plasma treatment used for semiconductor manufacturing or the like. Note that, in terms of production cost, the sputter metal thin film is most preferably oxidized by heat treatment in atmospheric air.

When a plasma polymerization film is further deposited over the second layer, a method can be used which deposits the film by a plasma CVD method using, e.g., hexamethyldisiloxane as a raw material.

When a resin film is deposited instead of the plasma polymerization film, a method which performs, e.g., dipping or spray coating can be used.

EXAMPLES

Hereinbelow, based on Examples, the present invention will be described in detail. However, Examples described below are not intended to limit the present invention, and changes made within a scope not departing from the above and following gist are all included in the technical scope of the present invention.

Production Examples 1 to 24

For each of substrates, polycarbonate (PC) having a diameter of 50.8 mm and a thickness of 1 mm was used and, as each of sputtering targets, a sputtering target made of pure Al or an Al-based alloy and having a diameter of 101.6 mm and a thickness of 5 mm was used. First, evacuation was performed such that a pressure in a sputtering chamber became not more than $1 \times 10^{-3}$ Pa. Then, into the sputtering chamber, an Ar gas was introduced, and the pressure in the sputtering chamber was adjusted to $2.6 \times 10^{-1}$ Pa. A DC (direct-current) power of 250 W was applied to an electrode to generate a plasma, and a sputtering target was sputtered to deposit a first layer (Al film) over each of the PC substrates. The distance between the sputtering target and the PC substrate was set to 80 mm, and the first layer was formed while the PC substrate was revolved.

After the Al film as the first layer was deposited, a second layer was formed by introducing an Ar gas into the sputtering chamber without opening the sputtering chamber, adjusting the pressure in the sputtering chamber to $2.6 \times 10^{-1}$ Pa, sputtering a sputtering target of a metal (such as Zr, Ti, Cr, Nb, Ta, or Mg) having a diameter of 101.6 mm and a thickness of 5 mm with a DC power of 200 W, and then performing oxidation. The oxidation method was such that each of the substrates was held in atmospheric air at a room temperature for 24 hours. The thicknesses of the first layer and the second layer were adjusted by controlling sputtering times.

For each of the reflective film laminates obtained in Production Examples 1 to 24, the contents of various additive elements in the first layer (Al film) were measured by the following method. In addition, under the following conditions, an alkali resistance test and a warm water resistance test were performed. The results of the tests are shown in Table 1.

<Contents of Various Additive Elements>

The contents of the various additive elements in each of Al-based alloy metal films were measured and determined by ICP (Inductively Coupled Plasma) atomic emission spectrometry or ICP mass spectrometry. Specifically, using an acid capable of dissolving each of Al and the various additive elements, each of the Al alloy films was totally dissolved, and the amounts of Al and the various additive elements in each of the obtained solutions were measured by ICP atomic emission spectrometry or ICP mass spectrometry, and normalized to 100% so that the composition (atomic %) of the Al-based alloy film was calculated.

<Visible Light Reflectivity (Initial Reflectivity)>

For the surface (surface with the second layer) of each of the reflective film laminates, a visible light reflectivity (initial reflectivity) was measured using light in a wavelength range of 380 to 780 nm in a D65 light source in accordance with the method shown in JIS R 3106.

<Alkali Resistance Test>

In a 1% by mass aqueous potassium hydroxide solution at a room temperature (25° C.), each of the reflective film laminates was immersed for 10 minutes.

For the surface (surface with the second layer) of each of the reflective film laminates after the immersion, a visible light reflectivity was measured using light in the wavelength range of 380 to 780 nm in the D65 light source in accordance with the method shown in JIS R 3106. A difference between the measured visible light reflectivity and a visible light reflectivity (initial reflectivity) measured by the same method prior to an alkali resistance test [i.e., Reflectivity Difference Between Before and After Test=Initial Reflectivity (%)−Visible Light Reflectivity After Alkali Resistance Test (%)] was determined, and alkali resistances were evaluated based on the differences between the reflectivity values. The reflective film laminate with a reflectivity value difference of not more than 5 was evaluated to be Excellent. The reflective film laminate with a reflectivity value difference of more than 5 and not more than 20 was evaluated to be Good. The reflective film laminate with a reflectivity value difference of more than 20 and not more than 30 was evaluated to be Fair. The reflective film laminate with a reflectivity value difference of more than 30 was evaluated to be Poor. Note that the reflective film laminate with a reflectivity value difference of not more than 30 (Excellent, Good, or Fair) was evaluated to be acceptable, and the reflective film laminate with a reflectivity value difference of more than 30 (Poor) was evaluated to be unacceptable.

<Warm Water Resistance Test>

In 40° C. ion exchange water, each of the reflective film laminates was immersed for 30 hours.

The surface (surface with the second layer having a surface area of 25.4 mm×25.4 mm×π) after the immersion was photographed with a digital camera, and the obtained sample photograph was binarized using an image processing software such that a transparent portion thereof was in black. Then, using an image analysis software, the area of the black portion (transparent portion) was determined, and then a film residual ratio was calculated according to the following expression. Note that foregoing π indicates a circumference ratio (the same holds true hereinafter).

Film Residual Ratio (%)=100×(25.4 mm×25.4 mm×π−Area of Transparent Portion (mm²))/(25.4 mm×25.4 mm×π)

The reflective film laminate with a film residual ratio of not less than 90% was evaluated to be Excellent, and the reflective film laminate with a film residual ratio of less than 90% was evaluated to be Poor.

TABLE 1

| Production example | First layer Al film composition | Second layer Film composition | Second layer Film thickness (nm) | Initial reflectivity (%) | Durability Alkali resistance Reflectivity after test (%) | Durability Alkali resistance Reflectivity difference before and after test | Durability Alkali resistance Evaluation | Warm water resistance Film residual ratio (%) | Warm water resistance Evaluation |
|---|---|---|---|---|---|---|---|---|---|
| 1 | Al | Zr | 4 | 89.4 | 64.4 | 25.0 | Fair | 100 | Good |
| 2 | Al—2.0Gd | Zr | 4 | 87.1 | 86.8 | 0.3 | Excellent | 100 | Good |
| 3 | Al | Ti | 4 | 88.7 | 59.0 | 29.7 | Fair | 100 | Good |
| 4 | Al—2.0Gd | Ti | 4 | 86.8 | 86.0 | 0.8 | Excellent | 100 | Good |
| 5 | Al—0.2Gd | Ti | 4 | 88.6 | 86.7 | 1.9 | Excellent | 100 | Good |
| 6 | Al—2.0Zr | Ti | 4 | 71.5 | 71.2 | 0.3 | Excellent | 100 | Good |
| 7 | Al—0.5Y | Zr | 4 | 88.4 | 88.0 | 0.4 | Excellent | 100 | Good |
| 8 | Al—0.3La | Zr | 4 | 87.1 | 86.1 | 1.0 | Excellent | 100 | Good |
| 9 | Al—0.2Gd | Cr | 4 | 85.5 | 84.8 | 0.7 | Excellent | 100 | Good |
| 10 | Al—0.2Gd | Nb | 4 | 86.1 | 85.2 | 0.9 | Excellent | 100 | Good |
| 11 | Al—0.2Gd | Ta | 4 | 86.3 | 85.5 | 0.8 | Excellent | 100 | Good |
| 12 | Al—0.2Gd | Zr | 1 | 87.3 | 85.9 | 1.4 | Excellent | 100 | Good |
| 13 | Al—0.2Gd | Zr | 8 | 78 | 77.9 | 0.1 | Excellent | 100 | Good |
| 14 | Al—3.0Mg | Zr | 2 | 87.1 | 84.4 | 2.7 | Excellent | 100 | Good |
| 15 | Al—3.0Mg | Ti | 2 | 88.7 | 86.9 | 1.8 | Excellent | 100 | Good |
| 16 | Al—0.2Gd—1.0Zr | Zr | 2 | 86.5 | 85.8 | 0.7 | Excellent | 100 | Good |
| 17 | Al—0.2Gd—2.0Mg | Zr | 2 | 85.1 | 83.9 | 1.2 | Excellent | 100 | Good |
| 18 | Al—1.0Zr—1.0Mg | Zr | 2 | 85.4 | 84.6 | 0.8 | Excellent | 100 | Good |
| 19 | Al—0.2Gd—0.5Zr—0.5Mg | Zr | 2 | 87.2 | 86.1 | 1.1 | Excellent | 100 | Good |
| 20 | Al—0.2Gd | 50Zr—50Ti | 4 | 83.1 | 82.9 | 0.2 | Excellent | 100 | Good |
| 21 | Al | — | — | 90.2 | 0.0 | 90.2 | Poor | 0 | Poor |
| 22 | Al—3.0Mg | — | — | 89.5 | 77.5 | 12.0 | Fair | 0 | Poor |
| 23 | Al—0.2Gd | Mg | 4 | 84.1 | 0.0 | 84.1 | Poor | 0 | Poor |
| 24 | Al—3.0Ge | Zr | 4 | 83.7 | 9.2 | 74.5 | Poor | 0 | Poor |

(1) Numeric characters in alloy film composition represent additive amount (atomic %) of each alloy element.
(2) Remainder of Al-based alloy film is Al and inevitable impurity.
(3) Pure Al film contains 99 atomic % or more of Al, with remainder being inevitable impurity.

From Production Examples 1 to 20, it can be seen that the reflective film laminate of the present invention has excellent alkali resistance and warm water resistance. Note that, from Production Examples 1 and 3 and Production Examples 2 and 4 to 20, it can be seen that, when the Al-based alloy films each containing a predetermined alloy component are used as the first layer, alkali resistance is remarkably excellent.

By contrast, from Production Examples 21 and 22, it can be seen that, in the case where the second layer is not provided, both or either one of alkali resistance and warm water resistance is poor.

Also, from Production Example 23, it can be seen that, when the type of the element used in the second layer is out of the scope of the present invention, each of alkali resistance and warm water resistance is poor.

From Production Example 24, it can be seen that, in the case where an Al-based alloy film containing Ge (element other than a predetermined alloy component) as an alloy element is used as the first layer, each of alkali resistance and warm water resistance is poor.

The present invention is useful in providing a reflective film laminate in which the reflectivity of an Al film is less likely to be reduced.

What is claimed is:

1. A vehicular lighting fixture comprising a reflective film laminate that comprises,
   a substrate comprising at least one material selected from the group consisting of glass, polycarbonate resin, acrylic resin, polyester resin, ABS resin, epoxy resin, acetal resin, and aliphatic hydrocarbon resin;
   a pure Al film or an Al-based alloy film as a first layer directly on the substrate; and
   an oxide film of a metal comprising one or more elements selected from the group consisting of Zr, Cr, V, Hf, Ta, W, and Mo as a second layer directly on the first layer, wherein
   a thickness of the second layer is 0.1 to 10 nm.

2. The vehicular lighting fixture according to claim 1, wherein the Al-based alloy film as the first layer comprises 0.05 to 2.5 atomic % of a rare earth metal element.

3. The vehicular lighting fixture according to claim 1, wherein the Al-based alloy film as the first layer comprises 0.05 to 3 atomic % of Zr.

4. The vehicular lighting fixture according to claim 1, wherein the Al-based alloy film as the first layer comprises 0.2 to 6.3 atomic % of Mg.

5. The vehicular lighting fixture according to claim 1, wherein the pure Al film as the first layer comprises 100 atomic % of Al; or not less than 98.5 atomic % and less than 100 atomic % of Al, with the remainder being an inevitable impurity.

6. The vehicular lighting fixture according to claim 1, wherein the second layer is an oxide film of one or more metals selected from the group consisting of Zr, Cr, and Ta.

7. A lighting device comprising a reflective film laminate that comprises,
   a substrate comprising at least one material selected from the group consisting of glass, polycarbonate resin, acrylic resin, polyester resin, ABS resin, epoxy resin, acetal resin, and aliphatic hydrocarbon resin;
   a pure Al film or an Al-based alloy film as a first layer directly on the substrate; and an oxide film of a metal comprising one or more elements selected from the group consisting of Zr, Cr, Y, Hf, Ta, W, and Mo as a second layer directly on the first layer, wherein a thickness of the second layer is 0.1 to 10 nm.

8. The lighting device according to claim 7, wherein the Al-based alloy film as the first layer comprises 0.05 to 2.5 atomic % of a rare earth metal element.

9. The lighting device according to claim 7, wherein the Al-based alloy film as the first layer comprises 0.05 to 3 atomic % of Zr.

10. The lighting device according to claim 7, wherein the Al-based alloy film as the first layer comprises 0.2 to 6.3 atomic % of Mg.

11. The lighting device according to claim 7, wherein the pure Al film as the first layer comprises 100 atomic % of Al; or not less than 98.5 atomic % and less than 100 atomic % of Al, with the remainder being an inevitable impurity.

12. The lighting device according to claim 7, wherein the second layer is an oxide film of one or more metals selected from the group consisting of Zr, Cr, and Ta.

13. An optical mirror comprising a reflective film laminate that comprises,
   a substrate comprising at least one material selected from the group consisting of glass, polycarbonate resin, acrylic resin, polyester resin, ABS resin, epoxy resin, acetal resin, and aliphatic hydrocarbon resin;
   a pure Al film or an Al-based alloy film as a first layer directly on the substrate; and
   an oxide film of a metal comprising one or more elements selected from the group consisting of Zr, Cr, Y, Hf, Ta, W, and Mo as a second layer directly on the first layer, wherein
   a thickness of the second layer is 0.1 to 10 nm.

14. The optical mirror according to claim 13, wherein the Al-based alloy film as the first layer comprises 0.05 to 2.5 atomic % of a rare earth metal element.

15. The optical mirror according to claim 13, wherein the Al-based alloy film as the first layer comprises 0.05 to 3 atomic % of Zr.

16. The optical mirror according to claim 13, wherein the Al-based alloy film as the first layer comprises 0.2 to 6.3 atomic % of Mg.

17. The optical mirror according to claim 13, wherein the pure Al film as the first layer comprises 100 atomic % of Al; or not less than 98.5 atomic % and less than 100 atomic % of Al, with the remainder being an inevitable impurity.

18. The optical mirror according to claim 13, wherein the second layer is an oxide film of one or more metals selected from the group consisting of Zr, Cr, and Ta.

19. A method for producing the vehicular lighting fixture according to claim 1, comprising:
   forming the first layer over the substrate; and
   sputtering a sputtering target made of the metal of the element according to claim 1 to form a sputtered metal thin film over the first layer, and then oxidizing the sputtered metal thin film in an atmosphere comprising oxygen to form the second layer.

20. A method for producing the lighting device according to claim 7, comprising the steps of:
   forming the first layer over the substrate; and
   sputtering a sputtering target made of the metal of the element according to claim 7 to form a sputtered metal thin film over the first layer, and then oxidizing the sputtered metal thin film in an atmosphere comprising oxygen to form the second layer.

* * * * *